US009048317B2

(12) United States Patent
Wann et al.

(10) Patent No.: US 9,048,317 B2
(45) Date of Patent: Jun. 2, 2015

(54) CONTACT STRUCTURE OF SEMICONDUCTOR DEVICE

(71) Applicant: Taiwan Semiconductor Manufacturing Company, Ltd., Hsin-Chu (TW)

(72) Inventors: Clement Hsingjen Wann, Carmel, NY (US); Ling-Yen Yeh, Hsinchu (TW); Chi-Wen Liu, Hsin-Chu (TW); Chi-Yuan Shih, Hsin-Chu (TW); Li-Chi Yu, Jhubei (TW); Meng-Chun Chang, Taipei (TW); Ting-Chu Ko, Hsin-Chu (TW); Chung-Hsien Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/955,853

(22) Filed: Jul. 31, 2013

(65) Prior Publication Data
US 2015/0035017 A1    Feb. 5, 2015

(51) Int. Cl.
*H01L 21/02*    (2006.01)
*H01L 29/78*    (2006.01)
*H01L 21/768*    (2006.01)
*H01L 23/48*    (2006.01)

(52) U.S. Cl.
CPC ............ *H01L 29/785* (2013.01); *H01L 21/768* (2013.01); *H01L 23/48* (2013.01)

(58) Field of Classification Search
None
See application file for complete search history.

(56) References Cited

U.S. PATENT DOCUMENTS

| 2012/0091538 A1* | 4/2012 | Lin et al. ................. 257/401 |
| 2013/0171790 A1 | 7/2013 | Wang |
| 2014/0001520 A1* | 1/2014 | Glass et al. .............. 257/288 |

FOREIGN PATENT DOCUMENTS

KR    1020130079976 A    7/2013

OTHER PUBLICATIONS

Lee, Rinus Tek Po et al., "Platinum Germanosilicide as Source/Drain Contacts in P-Channel Fin Field-Effect Transistors (FinFETs)," IEEE Transactions on Electron Devices, vol. 56, No. 7, Jul. 2009, pp. 1458-1465.

* cited by examiner

*Primary Examiner* — David Vu
*Assistant Examiner* — Cuong B Nguyen
(74) *Attorney, Agent, or Firm* — Slater & Matsil, L.L.P

(57) ABSTRACT

The disclosure relates to a semiconductor device. An exemplary structure for a contact structure for a semiconductor device comprises a substrate comprising a major surface; a fin structure extending upward from the substrate major surface, wherein the fin structure comprises a first fin, a second fin, and a third fin between the first fin and second fin; a first germanide over the first fin, wherein a first bottom surface of the first germanide has a first acute angle to the major surface; a second germanide over the second fin on a side of the third fin opposite to first germanide substantially mirror-symmetrical to each other; and a third germanide over the third fin, wherein a third bottom surface of the third germanide has a third acute angle to the major surface less than the first acute angle.

20 Claims, 15 Drawing Sheets

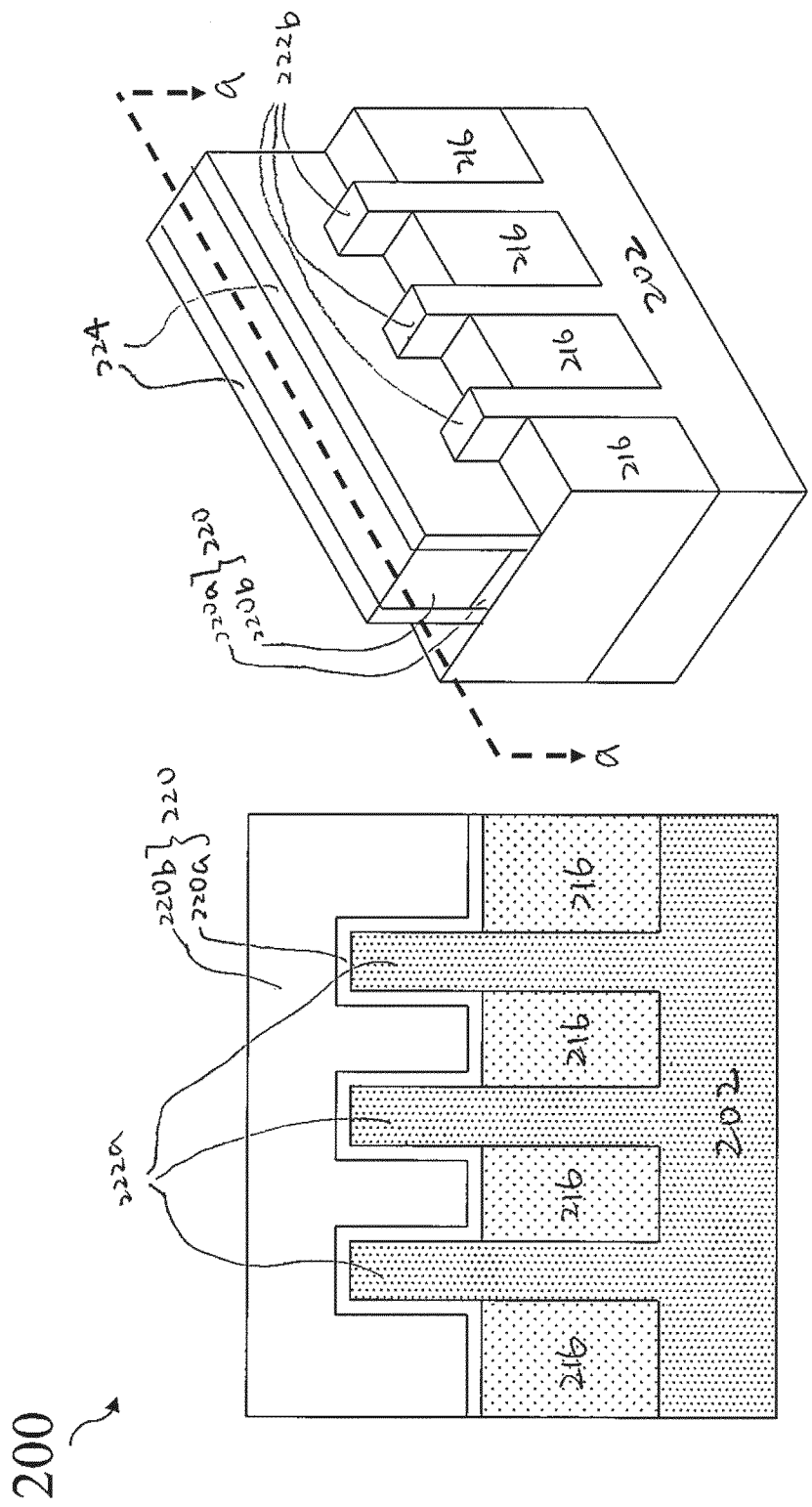

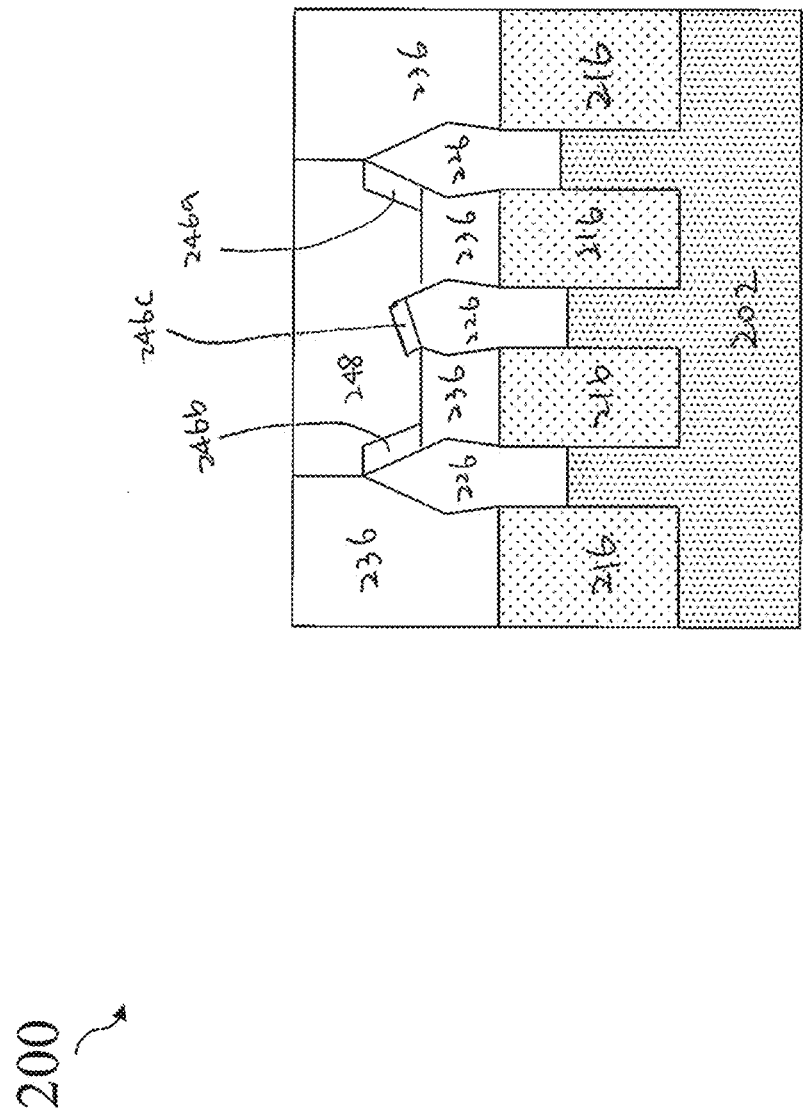

CONTACT STRUCTURE OF SEMICONDUCTOR DEVICE

TECHNICAL FIELD

The disclosure relates to integrated circuit fabrication, and more particularly to a semiconductor device with a contact structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, silicide formation on strained materials causes high contact resistance of source/drain regions of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-15 are perspective and cross-sectional views of a semiconductor device comprising a contact structure at various stages of fabrication according to various embodiments of the present disclosure.

DESCRIPTION

Figure 1:
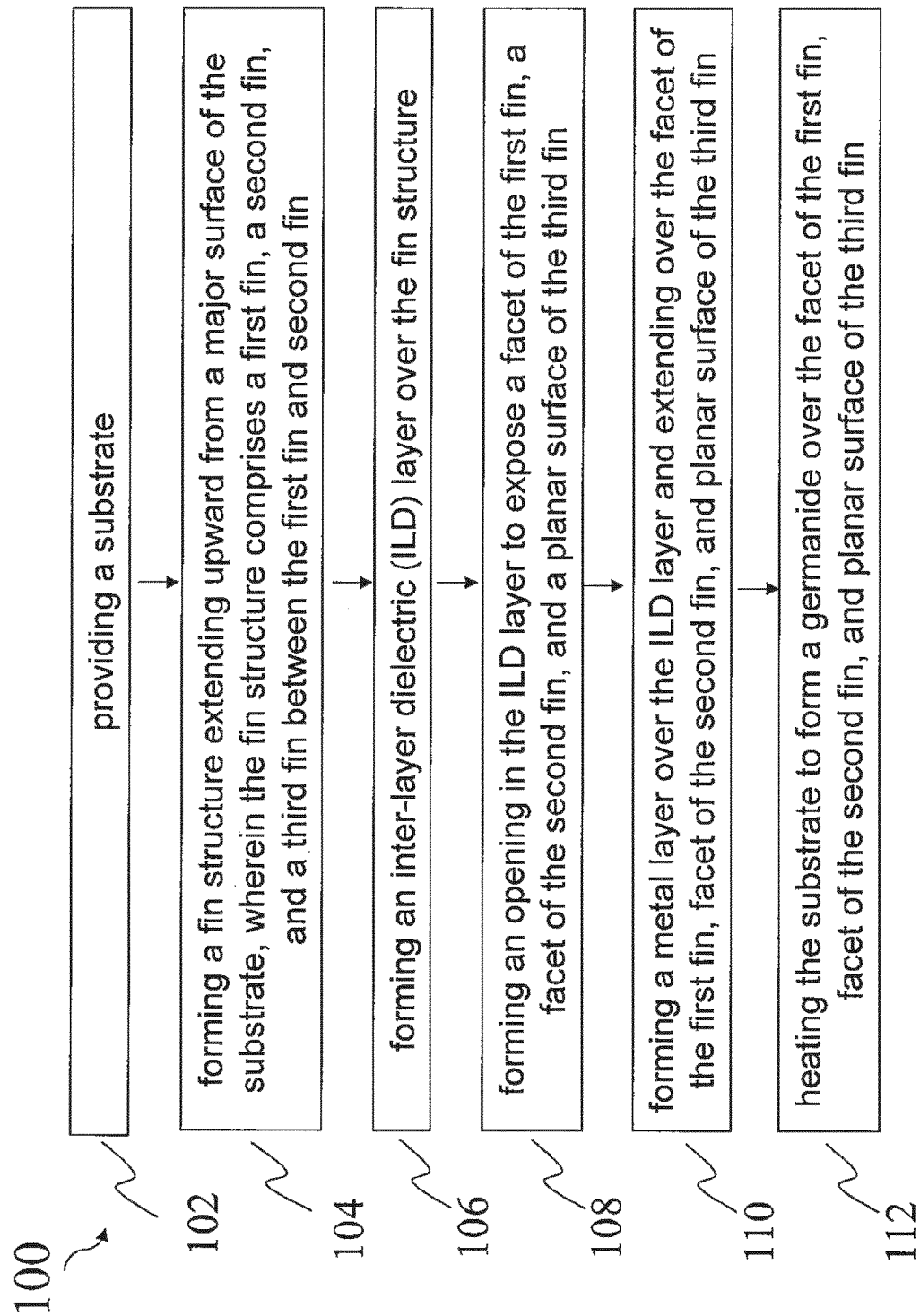
FIG. 1 is a flowchart illustrating a method of fabricating a contact structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device according to various aspects of the present disclosure. The method 100 begins with step 102 in which a substrate is provided. The method 100 continues with step 104 in which a fin structure extending upward from a major surface of the substrate is formed, wherein the fin structure comprises a first fin, a second fin, and a third fin between the first fin and second fin. The method 100 continues with step 106 in which an inter-layer dielectric (ILD) layer is formed over the fin structure. The method 100 continues with step 108 in which an opening is formed in the ILD layer to expose a facet of the first fin, a facet of the second fin, and a planar surface of the third fin. The method 100 continues with step 110 in which a metal layer is formed over the ILD layer and extending over the facet of the first fin, facet of the second fin, and planar surface of the third fin. The method 100 continues with step 112 in which the substrate is heated to form a germanide over the facet of the first fin, facet of the second fin, and planar surface of the third fin. The discussion that follows illustrates embodiments of semiconductor devices that can be fabricated according to the method 100 of FIG. 1.

FIGS. 2A-15 are perspective and cross-sectional views of a semiconductor device 200 comprising a contact structure 230 at various stages of fabrication according to various embodiments of the present disclosure. As employed in the present disclosure, the term semiconductor device 200 refers to a fin field effect transistor (FinFET) and is hereinafter referred to as FinFET 200. The FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2A through 15 are simplified for a better understanding of the concepts of the present disclosure. For example, although the figures illustrate the semiconductor device 200, it is understood the IC may comprise a number of other devices comprising resistors, capacitors, inductors, fuses, etc.

Figures 2A, 2B:
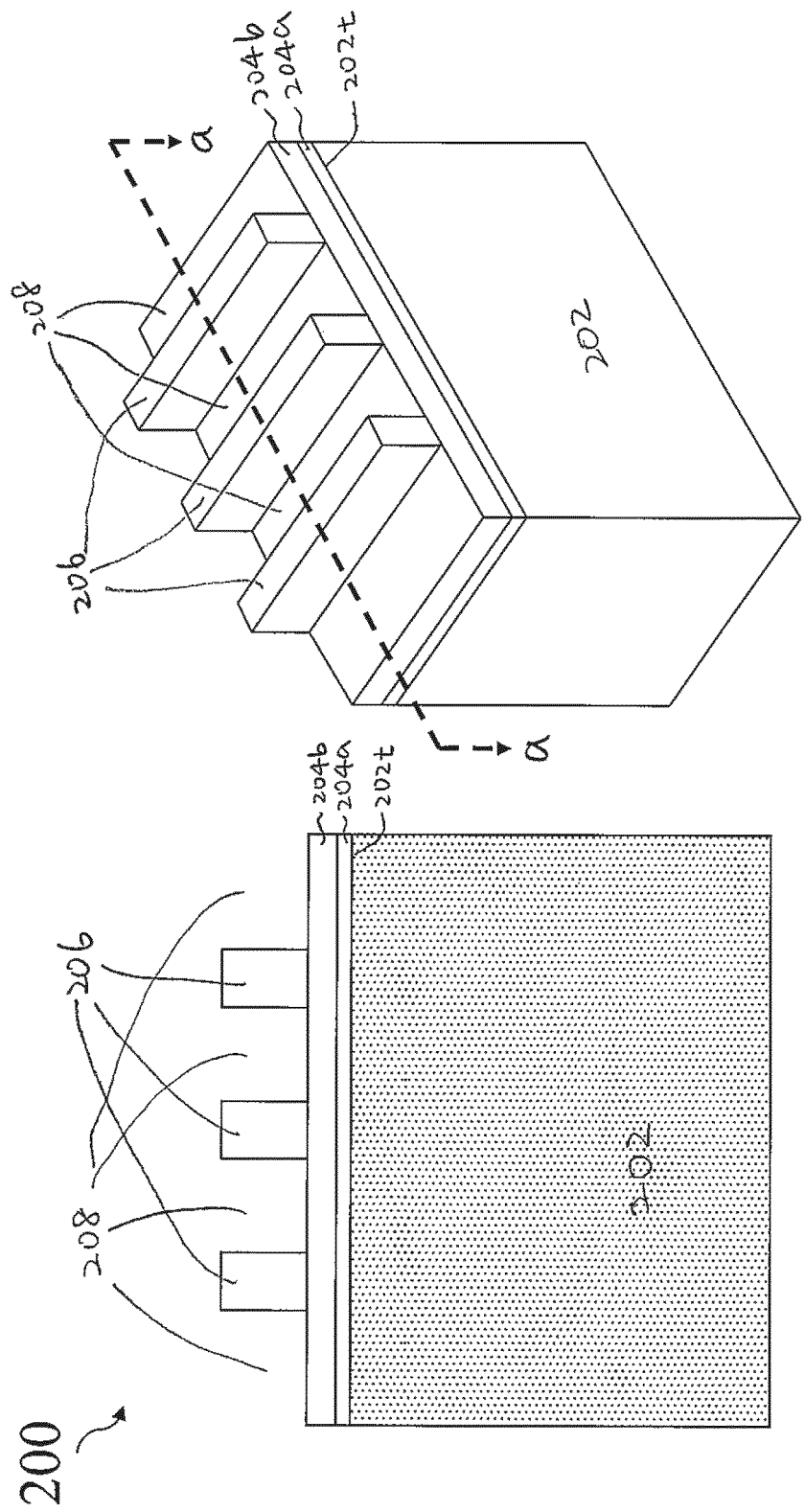

Referring to FIGS. 2A and 2B, and step 102 in FIG. 1, a substrate 202 is provided. FIG. 2A is a perspective view of the semiconductor device 200 having a substrate 202 at one of the various stages of fabrication according to an embodiment, and FIG. 2B is a cross-sectional view of semiconductor device 200 taken along the line a-a of FIG. 2A. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3A:
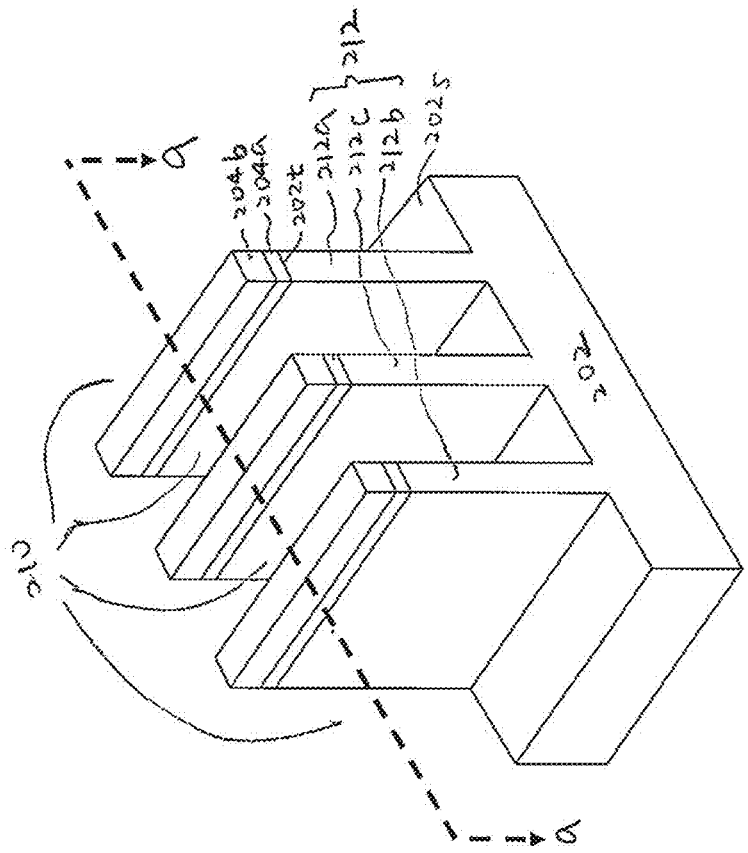
Figure 3B:
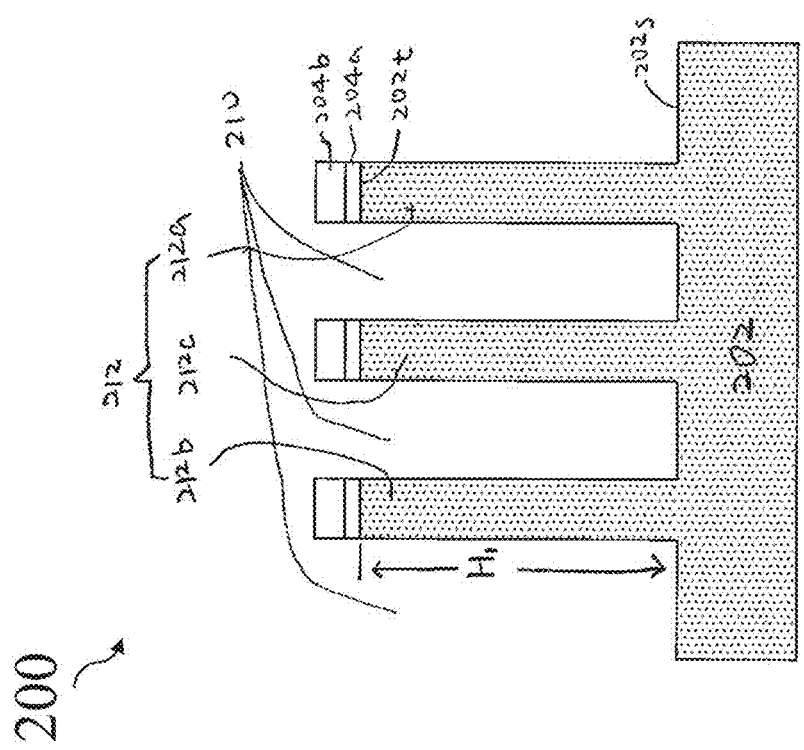

Referring to FIGS. 3A and 3B, and step 104 in FIG. 1, after formation of the openings 208 in the photo-sensitive layer 206, the structure in FIGS. 3A and 3B is produced by forming a fin structure 212 extending upward from a major surface 202s of the substrate 202, wherein the fin structure 212 comprises a first fin 212a, a second fin 212b, and a third fin 212c between the first fin 212a and second fin 212b.

FIG. 3A is a perspective view of the semiconductor device 200 at one of the various stages of fabrication according to an embodiment, and FIG. 3B is a cross-sectional view of semiconductor device 200 taken along the line a-a of FIG. 3A. The mask layer 204b and pad layer 204a are etched through openings 208 to expose underlying semiconductor substrate 202. The exposed semiconductor substrate 202 is then etched to form trenches 210 lower than the top surface 202t of the semiconductor substrate 202. Portions of the semiconductor substrate 202 between trenches 210 form semiconductor fins (i.e., the fin structure 212). In the depicted embodiment, the semiconductor fins 212 extend downward from the substrate top surface 202t to the major surface 202s to a first height $H_1$, thereby extending upward from the major surface 202s of the substrate 202. The photo-sensitive layer 206 is then removed. Next, a cleaning may be performed to remove a native oxide of the semiconductor substrate 202. The cleaning may be performed using diluted hydrofluoric (DHF) acid.

Figures 4A, 4B:
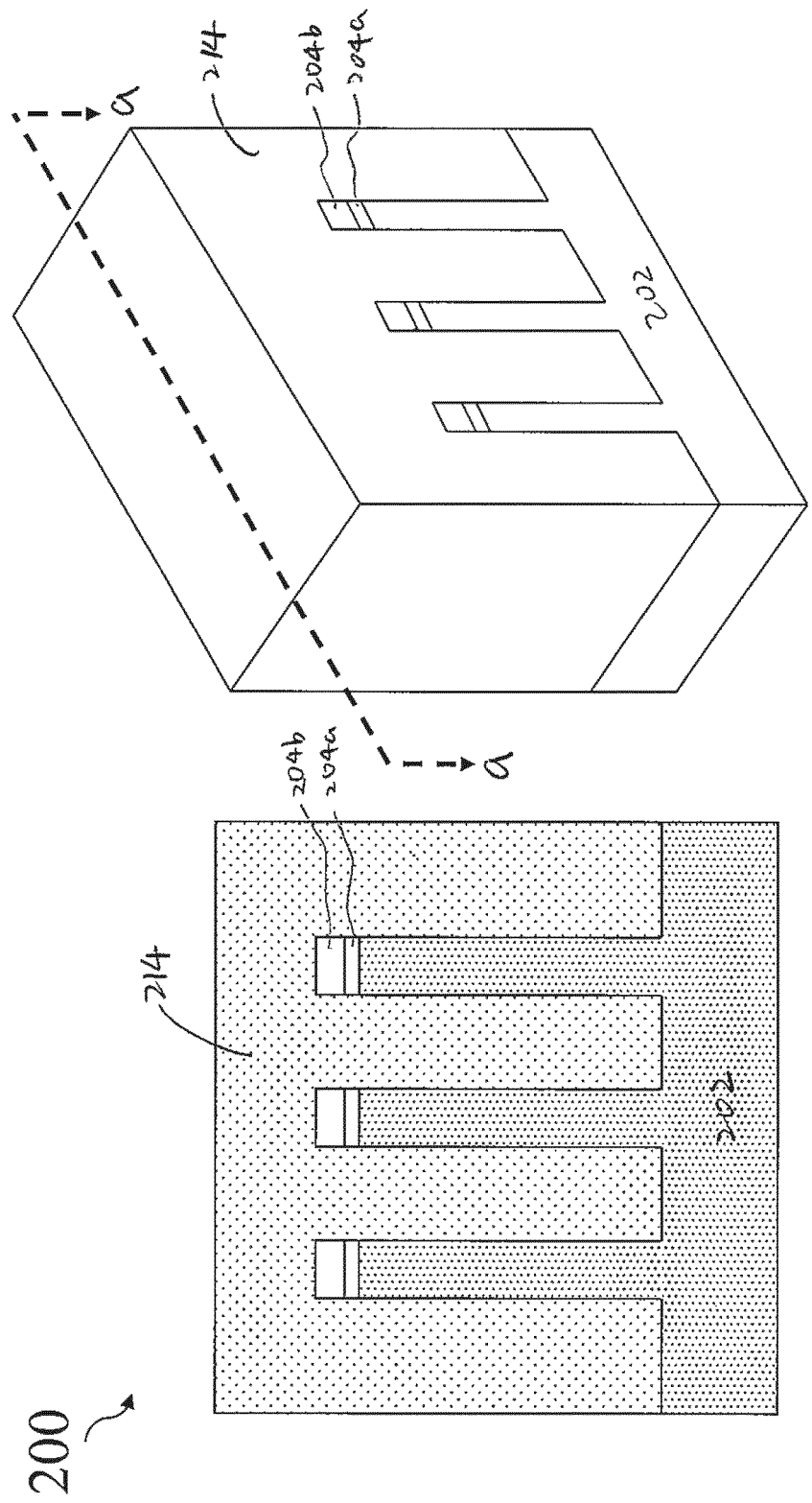

FIG. 4A is a perspective view of the semiconductor device 200 at one of the various stages of fabrication according to an embodiment, and FIG. 4B is a cross-sectional view of semiconductor device 200 taken along the line a-a of FIG. 4A. Trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In an embodiment, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

Figure 5A:
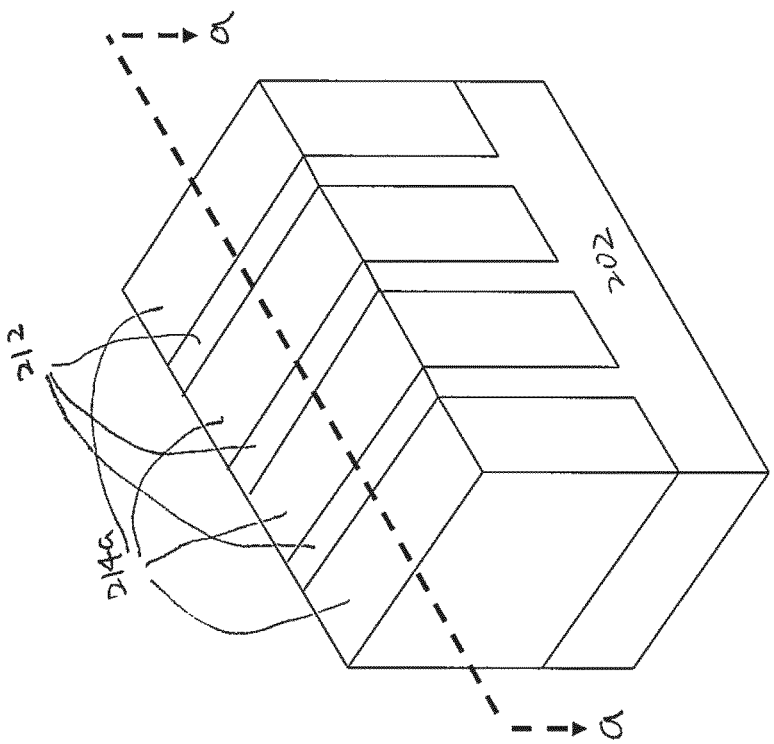
Figure 5B:
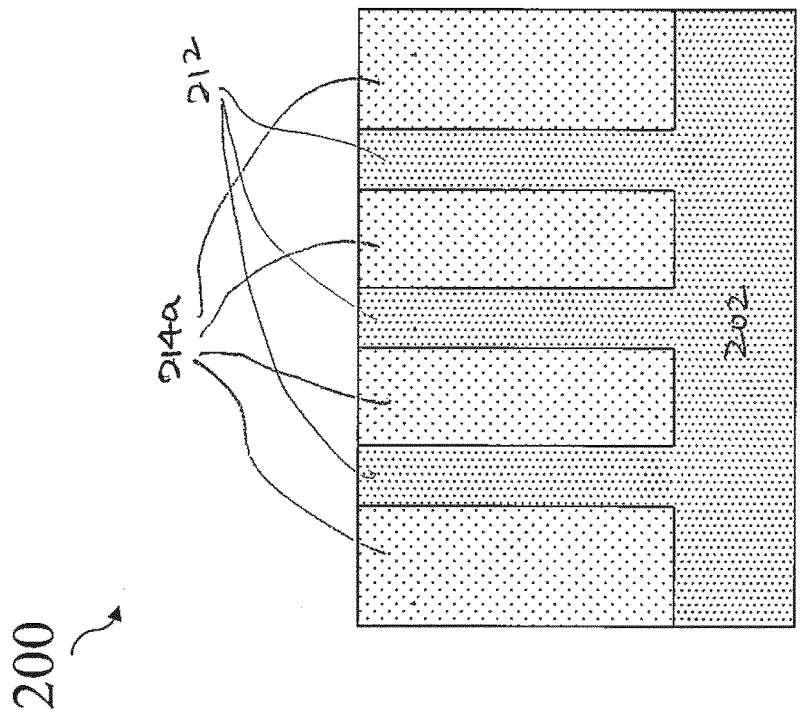

FIGS. 4A and 4B depict the resulting structure after the deposition of the dielectric material 214. A chemical mechanical polish is then performed, followed by the removal of the mask layer 204b and pad layer 204a. The resulting structure is shown in FIGS. 5A and 5B. FIG. 5A is a perspective view of the semiconductor device 200 at one of the various stages of fabrication according to an embodiment, and FIG. 5B is a cross-sectional view of semiconductor device 200 taken along the line a-a of FIG. 5A. The remaining portions of the oxide 214 in the trenches 210 are hereinafter referred to as an isolation layer 214a. In one embodiment, the mask layer 204b is formed of silicon nitride, the mask layer 204b may be removed using a wet process using hot $H_3PO_4$, while pad layer 204a may be removed using diluted HF acid, if formed of silicon oxide. In some embodiments, the removal of the mask layer 204b and pad layer 204a may be performed after the recessing of the isolation layer 214a, which recessing step is shown in FIGS. 6A and 6B.

Figures 6A, 6B:
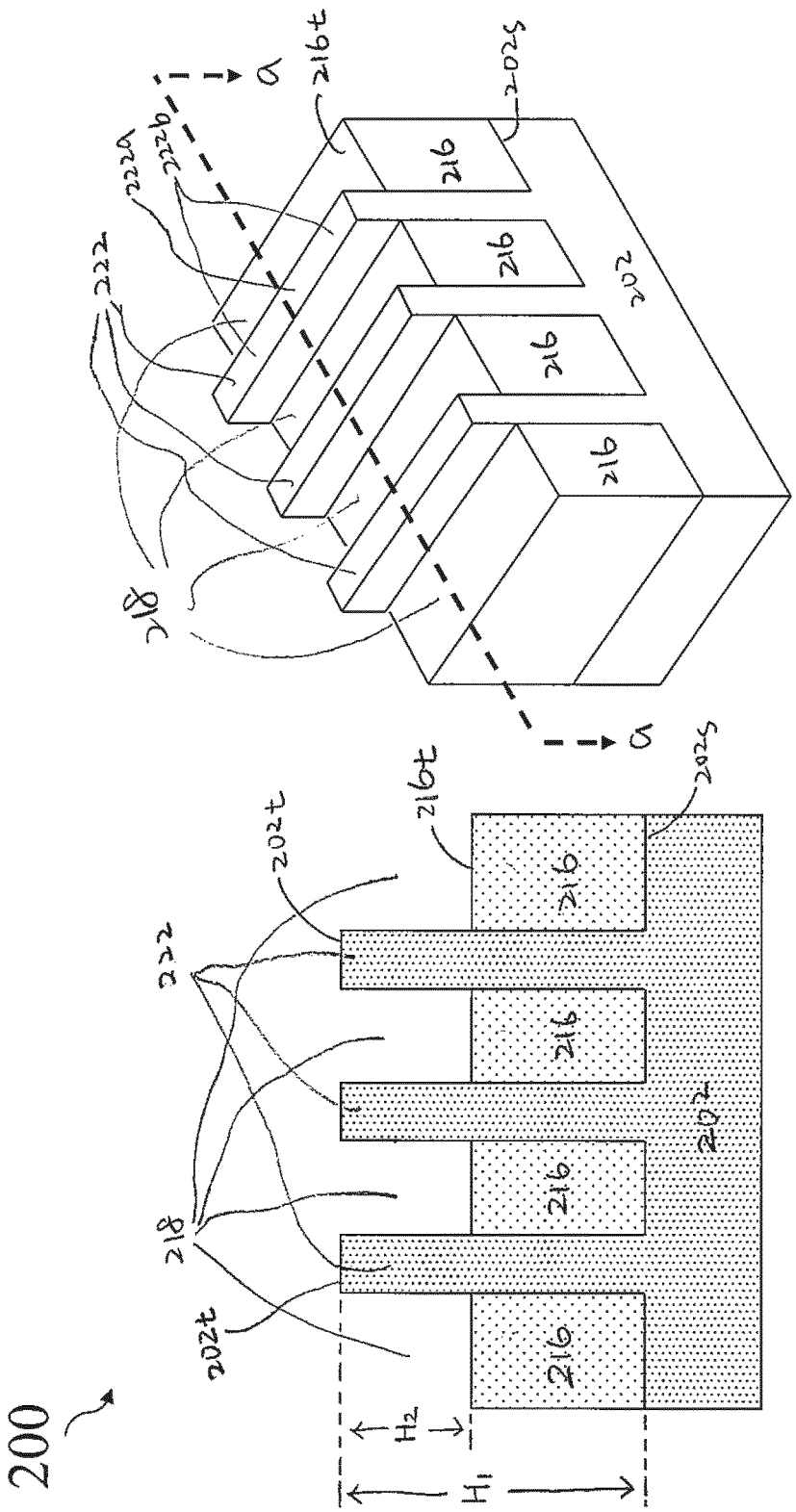

As shown in FIGS. 6A and 6B, after the removal of the mask layer 204b and pad layer 204a, the isolation layer 214a is recessed by an etching step, resulting in recesses 218 and a remaining isolation layer 214a. The remaining portion of the isolation layer 214a in the trenches 210 is hereinafter referred to as a shallow trench isolation (STI) region 216. The STI region 216 within the substrate 202 comprises a top surface 216t. FIG. 6A is a perspective view of the semiconductor device 200 at one of the various stages of fabrication according to an embodiment, and FIG. 6B is a cross-sectional view of semiconductor device 200 taken along the line a-a of FIG. 6A. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

In the depicted embodiment, upper portions 222 of the fins 212 extend downward from the substrate top surface 202t to the top surface 216t to a second height $H_2$ less than the first height $H_1$, thereby extending beyond the top surface 216t of the STI region 216. In one embodiment, a ratio of the second height $H_2$ to the first height $H_1$ is from about 0.2 to about 0.5. The second height $H_2$ of the upper portion 222 of the fins 212 may be between 15 nm and about 50 nm, although it may also be greater or smaller. In the depicted embodiment, the upper portions 222 of the fins 212 may comprise channel portions 222a and source/drain (S/D) portions 222b. The channel portions 222a are used to form channel regions of the semiconductor device 200.

FIG. 7A is a perspective view of the semiconductor device 200 at one of the various stages of fabrication according to an embodiment, and FIG. 7B is a cross-sectional view of semiconductor device 200 taken along the line a-a of FIG. 7A. A gate stack 220 is formed over the channel portions 222a of the upper portion 222 of the fins 212 and extending to the top surface 216t of the STI region 216. In some embodiments, the gate stack 220 comprises a gate dielectric layer 220a and a gate electrode layer 220b over the gate dielectric layer 220a.

In FIGS. 7A and 7B, the gate dielectric 220a is formed to cover the channel portions 222a of the upper portions 222 of the fins 212. In some embodiments, the gate dielectric layer 220a may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 220a is a high-k dielectric layer with a thickness in the range of about 10 to 30 angstroms. The gate dielectric layer 220a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 220a may further comprise an interfacial layer (not shown) to reduce damage between the gate dielectric layer 220a and channel portions 222a of the upper portions 222 of the fins 212. The interfacial layer may comprise silicon oxide.

The gate electrode layer 220b is then formed on the gate dielectric layer 220a. In some embodiments, the gate electrode layer 220b may comprise a single layer or multilayer structure. In the present embodiment, the gate electrode layer 220b may comprise poly-silicon. Further, the gate electrode layer 220b may be doped poly-silicon with uniform or non-uniform doping. In some alternative embodiments, the gate electrode layer 220b may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220b comprises a thickness in the range of about 30 nm to about 60 nm. The gate electrode layer 220b may be formed using a suitable process such as ALD, CVD, PVD, plating, or combinations thereof.

Still referring to FIG. 7A, the semiconductor device 200 further comprises a dielectric layer 224 formed over the substrate 202 and along the side of the gate stack 220. In some embodiments, the dielectric layer 224 may include silicon oxide, silicon nitride, silicon oxy-nitride, or other suitable material. The dielectric layer 224 may comprise a single layer or multilayer structure. A blanket layer of the dielectric layer 224 may be formed by CVD, PVD, ALD, or other suitable technique. Then, an anisotropic etching is performed on the dielectric layer 224 to form a pair of spacers on two sides of the gate stack 220. The dielectric layer 224 comprises a thickness ranging from about 5 to 15 nm.

Figure 8A:
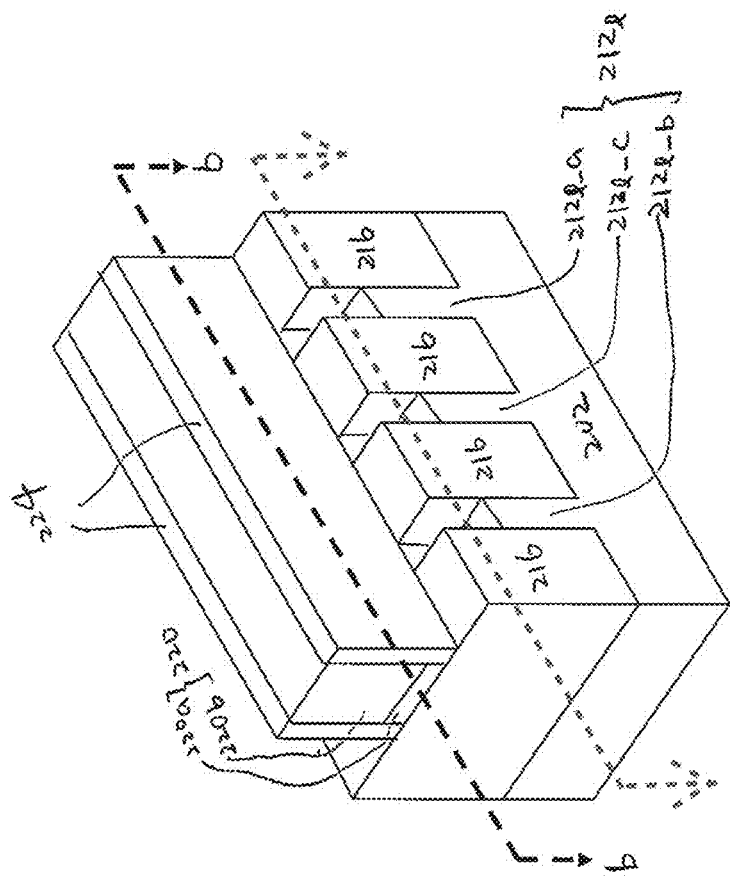
Figure 8B:
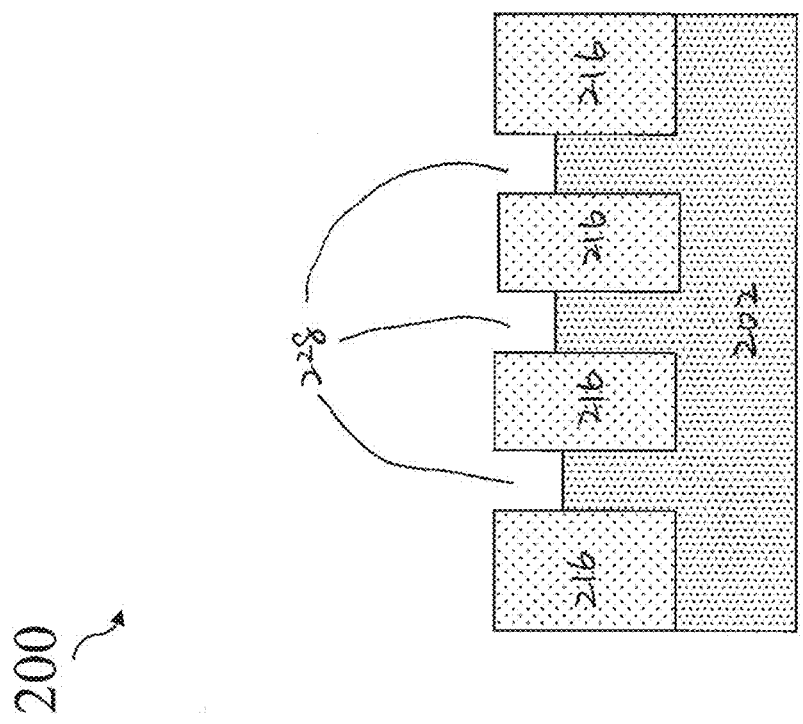

FIG. 8A is a perspective view of the semiconductor device 200 at one of the various stages of fabrication according to an embodiment, and FIG. 8B is a cross-sectional view of semiconductor device 200 taken along the line b-b of FIG. 8A. Using the gate stack 220, dielectric layer 224, and STI region 216 as hard masks, a biased etching process is performed to recess the S/D portions 222b (shown in FIGS. 6A and 7A) of the upper portions 222 of the fins 212 that are unprotected or exposed to form the S/D cavities 228 below the top surface 202t, thereby leaving lower portions 2121 (comprising 2121_a, 2121_b, and 2121_c) of the fin structure 212. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

Figure 9A:
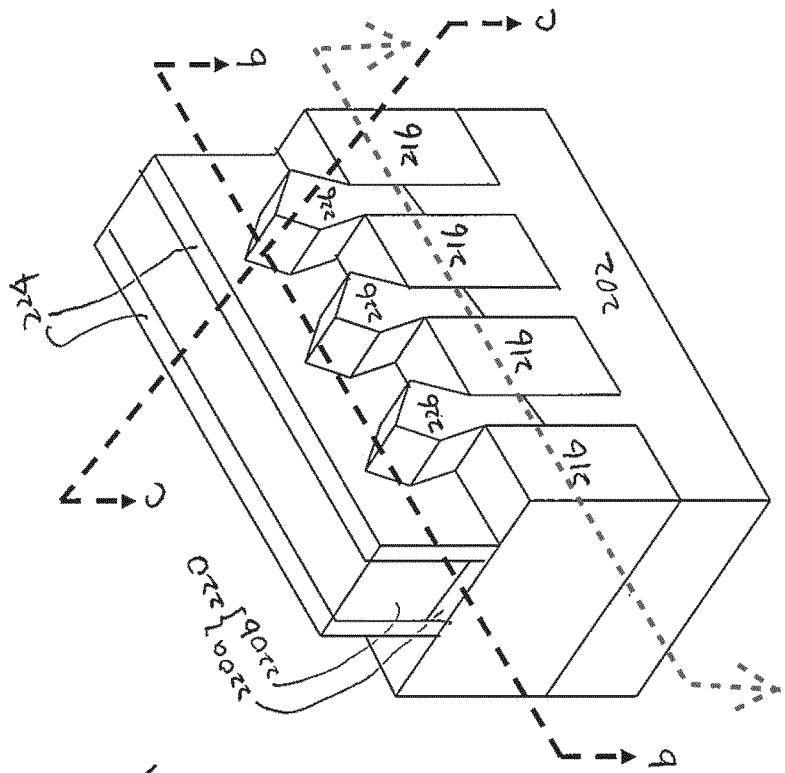
Figure 9B:
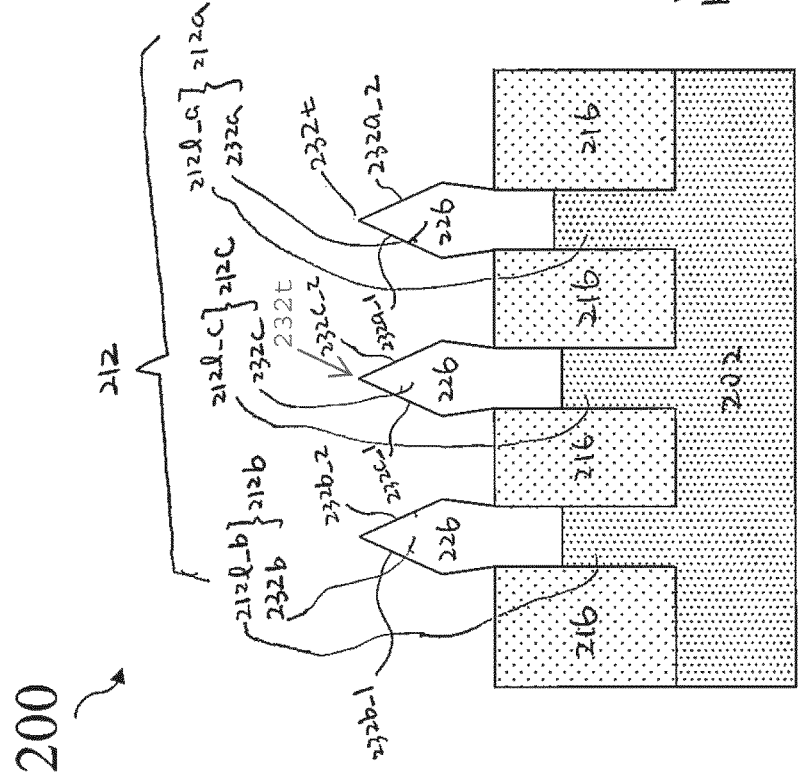

Referring to FIGS. 9A and 9B, after the formation of the S/D cavities 228 in the S/D portions 222b, the structure in FIGS. 9A and 9B is produced by epi-growing a strained material 226 in the S/D cavities 228, wherein a lattice constant of the strained material 226 is different from a lattice constant of the substrate 202. FIG. 9A is a perspective view of the semiconductor device 200 at one of the various stages of fabrication according to an embodiment, and FIG. 9B is a cross-sectional view of semiconductor device 200 taken along the line b-b of FIG. 9A. In some embodiments, the strained material 226 comprises Ge or SiGe for a p-type FinFET.

In some embodiments, the strained material 226 is hereinafter referred to as S/D regions 232 (comprising 232a, 232b, and 232c). The first S/D region 232a comprises a first facet 232a_1 and a second facet 232a_2. The second S/D region 232b comprises a third facet 232b_1 and a fourth facet 232b_2. The third S/D region 232c comprises a fifth facet 232c_1 and a sixth facet 232c_2.

In some embodiments, the first S/D region 232a and lower portion 2121_a are combined and also hereinafter referred to as the first fin 212a, while the second S/D region 232b and lower portion 2121_b are combined and also hereinafter referred to as the second fin 212b, while the third S/D region 232c and lower portion 2121_c are combined and also hereinafter referred to as the third fin 212c. In some embodiments, the first fin 212a, second fin 212b, and third fin 212c are combined and also hereinafter referred to as the fin structure 212.

In the Ge-growing embodiment, a pre-cleaning process may be performed to clean the S/D cavities 228 with HF or other suitable solution. Then, the strained material 226 such as germanium (Ge) is selectively grown by an LPCVD process to fill the S/D cavities 228. In one embodiment, the LPCVD process is performed under a pressure of about 10 mTorr to about 100 mTorr, at a temperature of about 350° C. to about 450° C., using $GeH_4$, $GeH_3CH_3$, and/or $(GeH_3)_2CH_2$ as epitaxial gases. Optionally, an anneal process after the epitaxial process is performed at a temperature of about 550° C. to about 750° C. to confine dislocation defects on the interface of the strained material 226 and lower portions 2121 of the fin structure 212.

In the SiGe-growing embodiment, a pre-cleaning process may be performed to clean the S/D cavities 228 with HF or other suitable solution. Then, the strained material 226 such as silicon germanium (SiGe) is selectively grown by an LPCVD process to fill the S/D cavities 228. In one embodiment, the LPCVD process is performed at a temperature of about 660° C. to about 700° C. and under a pressure of about 13 to about 50 Torr, using $SiH_2Cl_2$, HCl, $GeH_4$, $B_2H_6$, and $H_2$ as reaction gases.

The process steps up to this point have provided the substrate 202 having the strained material 226 over each lower portion 2121. Conventionally, metal germanide over the strained material 226 may be formed by blanket depositing a thin layer of metal material, such as Ni, Pt, Ti, Co, Pd, and combinations thereof. The substrate 202 is then heated, which causes Ge to react with the metal where contacted. After the reaction, a layer of metal germanide is formed between the Ge-containing material and the metal. The un-reacted metal is selectively removed through the use of an etchant that attacks the metal material but does not attack germanide. However, transition point 232t of the facets (such as the fifth facet 232c_1 and sixth facet 232c_2) may provide more surface free energy, resulting in triangular germanide formation adjacent to the transition point 232t but no germanide formation far away from the transition point 232t. This small-volume germanide on the strained material 226 causes high contact resistance of S/D regions of the FinFET and thus degrades the device performance.

Accordingly, the processing discussed below with reference to FIGS. 10-15 may form a contact structure comprising a rectangular germanide to replace the triangular germanide. The rectangular germanide with more volume may serve as a low-resistance intermediate layer to replace high-resistance triangular germanide with less volume. As such, the contact structure may provide low contact resistance of S/D regions of the semiconductor device, thereby enhancing the device performance.

Figure 10:
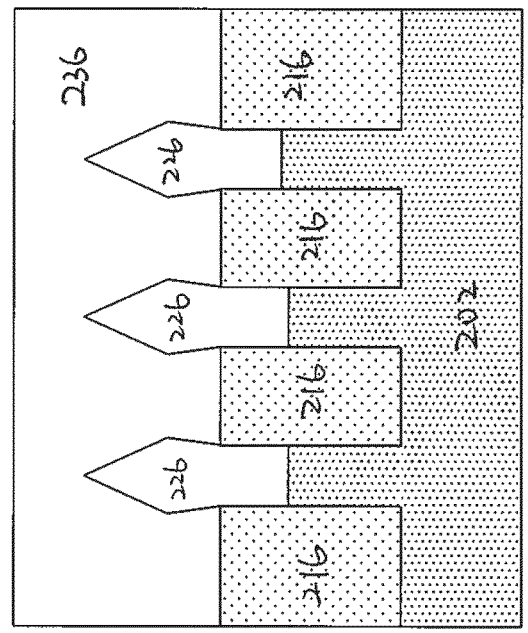

FIGS. 10-15 also are cross-sectional views of the FinFET 200 taken along the line b-b of FIG. 9A at one of the various stages of fabrication according to an embodiment As depicted in FIG. 10 and step 106 in FIG. 1, for fabricating a contact structure (such as a contact structure 230 shown in FIG. 13) of the semiconductor device 200, the structure in FIG. 10 is produced by forming an inter-layer dielectric (ILD) layer 236 over the strained material 226 (i.e., fin structure 212) and STI regions 216.

The ILD layer 236 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 236 may be formed over the fin structure 212 by CVD, high density plasma (HDP) CVD, sub-atmospheric CVD (SACVD), spin-on, sputtering, or other suitable methods. In the present embodiment, the ILD layer 236 has a thickness in the range of about 4000 Å to about 8000 Å. It is understood that the ILD layer 236 may comprise one or more dielectric materials and/or one or more dielectric layers.

Subsequently, the ILD layer 236 is planarized using a CMP process until a top surface of the gate electrode layer 220b is exposed or reached (not shown). The CMP process has a high selectivity to provide a substantially planar surface for the gate electrode layer 220b and ILD layer 236.

Figure 11:
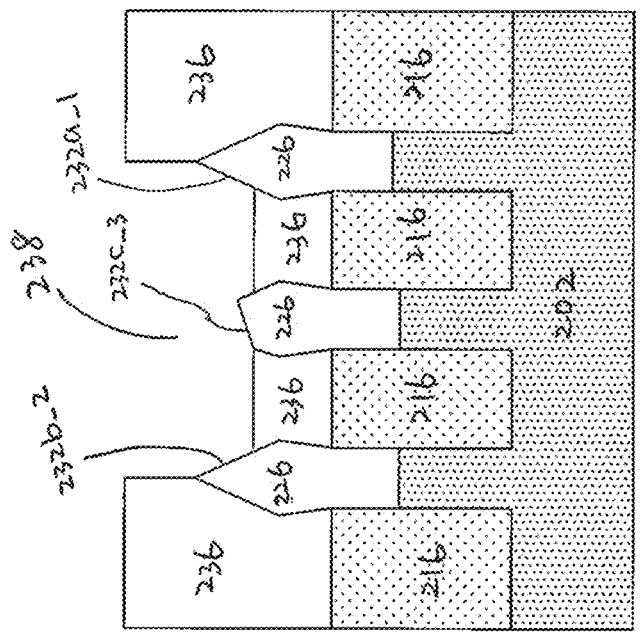

Subsequent CMOS processing steps applied to the semiconductor device 200 of FIG. 10 comprise forming contact opening through the ILD layer 236 to provide electrical contacts to S/D regions of the semiconductor device 200. Referring to FIG. 11, the structure in FIG. 11 is produced by forming an opening 238 in the ILD layer 236 to expose a facet (such as the first facet 232a_1) of the first fin 212a, a facet (such as the fourth facet 232b_2) of the second fin 212b, and a substantially planar surface 232c_3 of the third fin 212c (step 108 in FIG. 1).

As one example, the formation of the opening 238 includes forming a layer of photoresist (not shown) over the ILD layer 236 by a suitable process, such as spin-on coating, patterning the layer of photoresist to form a patterned photoresist feature by a proper lithography method, etching the exposed ILD layer 236 (for example, by using a dry etching, wet etching, and/or plasma etching process) to remove a portion of the ILD layer 236 to expose portions of the strained material 226 (such as the first facet 232a_1 and the fourth facet 232b_2), while etching a portion of strained material 226 adjacent to the transition point 232t to create the substantially planar surface 212c_3. In some embodiments, the plasma etching process may be performed using HCl or Cl2 as etching gases with a bias power. The patterned photoresist layer may be stripped thereafter.

Figure 12:
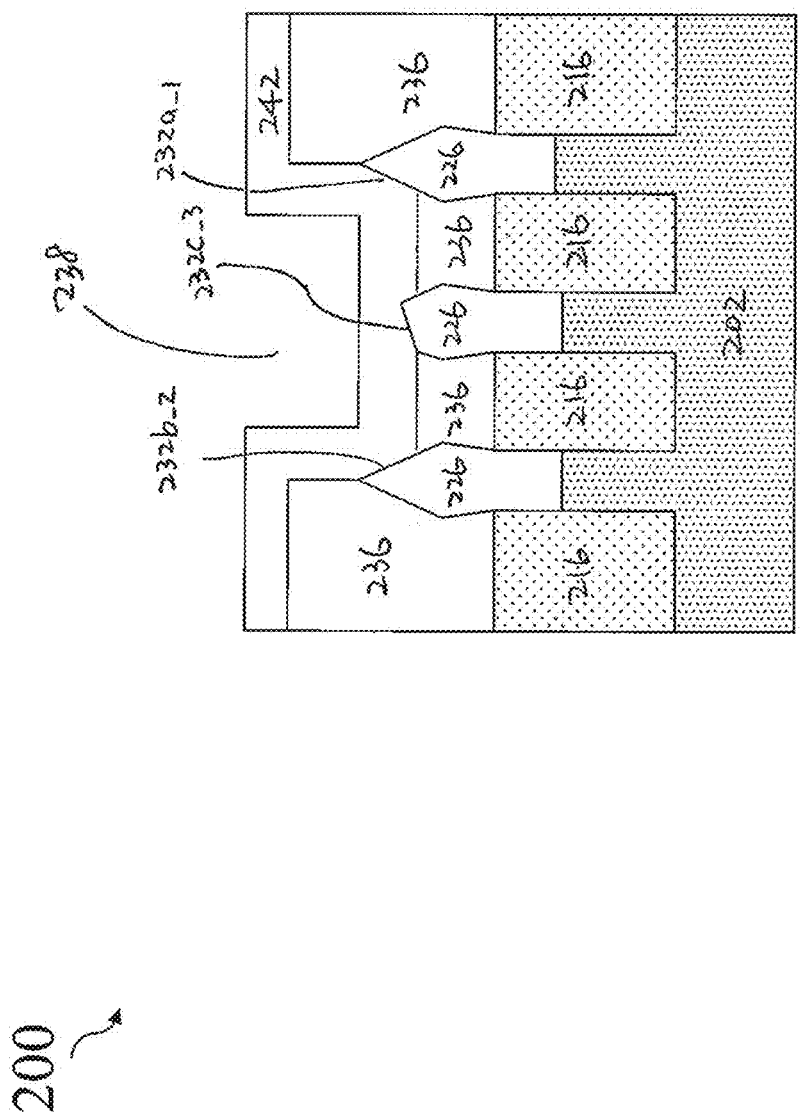

Referring to FIG. 12 and step 110 in FIG. 1, subsequent to the formation of the opening 238 in the ILD layer 236, the structure depicted in FIG. 12 is produced by forming a first metal layer 242 over the ILD layer 236 and extending over the facet (i.e., the first facet 232a_1) of the first fin 212a, facet (i.e., the fourth facet 232b_2) of the second fin 212b, and substantially planar surface 232c_3 of the third fin 212c. In some embodiments, the first metal layer 242 comprises Ni, Pt, Ti, Co, or Pd. In some embodiments, the first metal layer 242 may be formed by CVD, PVD, plating, ALD, or other suitable technique to a thickness of between about 15 and 60 angstroms.

Figure 13:
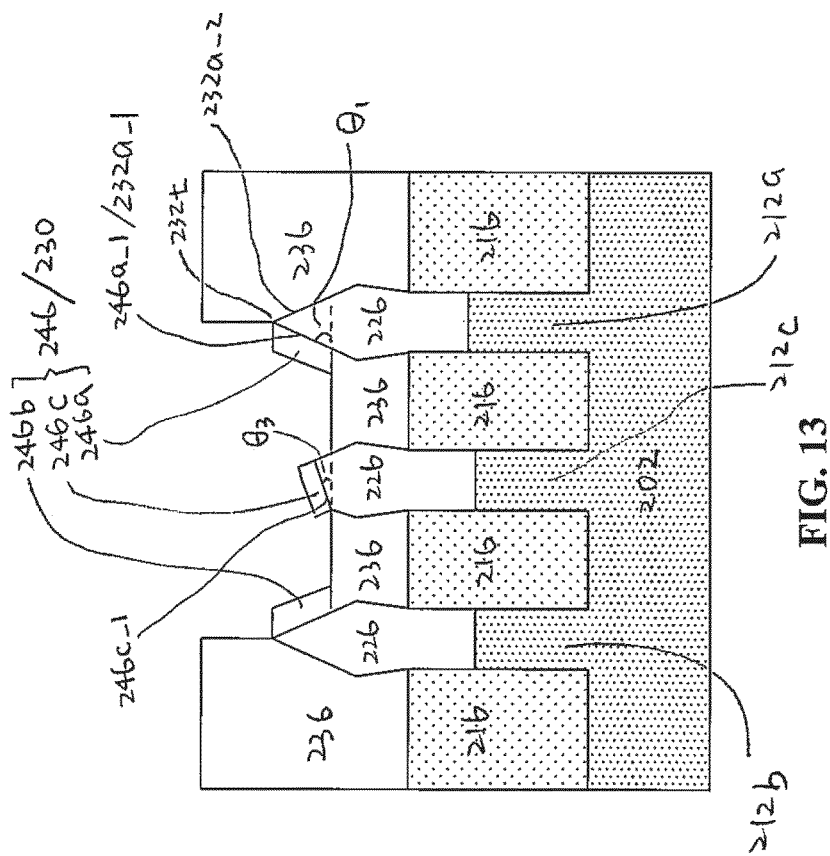

Then, the structure depicted in FIG. 13 is produced by heating the substrate to form a germanide 246 (comprising a first germanide 246a, second germanide 246b, and third germanide 246c) over the facet (i.e., the first facet 232a_1) of the first fin 212a, facet (i.e., the fourth facet 232b_2) of the second fin 212b, and planar surface 232c_3 of the third fin 212c (step 112 in FIG. 1). In other words, the first metal layer 242 in contact with the strained material 226 is then transformed into a germanide by a thermal process, such as a rapid thermal anneal (RTA) process. In some embodiments, the germanide 246 comprises NiGe, PtGe, TiGe$_2$, CoGe$_2$, or PdGe.

In the NiGe embodiment, a first RTA process is applied to heat the substrate 202 at a temperature of about 200° C. to 300° C. The first metal layer 242 in contact with the strained material 226 will form a high-resistance germanide. Then, the remaining un-reacted first metal layer 242 is removed using, for example, a solution comprising NH$_4$OH, H$_2$O$_2$, and deionized water. In order to transform the high-resistance silicide to a low-resistance germanide, a second RTA process is applied to heat the substrate 202 at a temperature of about 300° C. to about 400° C., thereby forming a nickel germanide (NiGe) 246.

In some embodiments, with respect to the example depicted in FIG. 13, the contact structure 230 for the semiconductor device 200 comprises the first germanide 246a over the first fin 212a, wherein a first bottom surface 246a_1 of the first germanide 246a has a first acute angle $\theta_1$ to the major surface 202s; the second germanide 246b over the second fin 212b on a side of the third fin 212c opposite to first germanide 246a substantially mirror-symmetrical to each other; and the third germanide 246c over the third fin 212c, wherein a third bottom surface 246c_1 of the third germanide 246c has a third acute angle $\theta_3$ to the major surface 202s less than the first acute angle $\theta_1$. In some embodiments, a ratio of the third acute angle $\theta_3$ to the first acute angle $\theta_1$ is from about 0.05 to about 0.5.

In some embodiments, the first fin 212a comprises a first facet 232a_1 facing toward the third fin 212c and a second facet 232a_2 facing away from the third fin 212c, wherein the first germanide 246a is only on the first facet 232a_1. In some embodiment, the third fin 212c comprises a substantially planar surface (i.e. the third bottom surface 246c_1) lower than a transition point 232t see FIG. 9B) of the first facet 232a_1 and second facet 232a_2, wherein the third germanide 246c is on the substantially planar surface. In some embodiments, a first area (not shown) of the first germanide 246a is greater than a third area (not shown) of the third germanide 246c. In some embodiments, a ratio of the third area to the first area is from about 0.3 to about 0.9.

In the depicted embodiment, the STI region 216 is disposed on one side of the gate stack 220 taken along the line c-c of FIG. 9A at one of the various stages of fabrication according to an embodiment. As such, the contact structure 230 is distributed between the gate stack 220 and the STI region 216.

Figure 14:
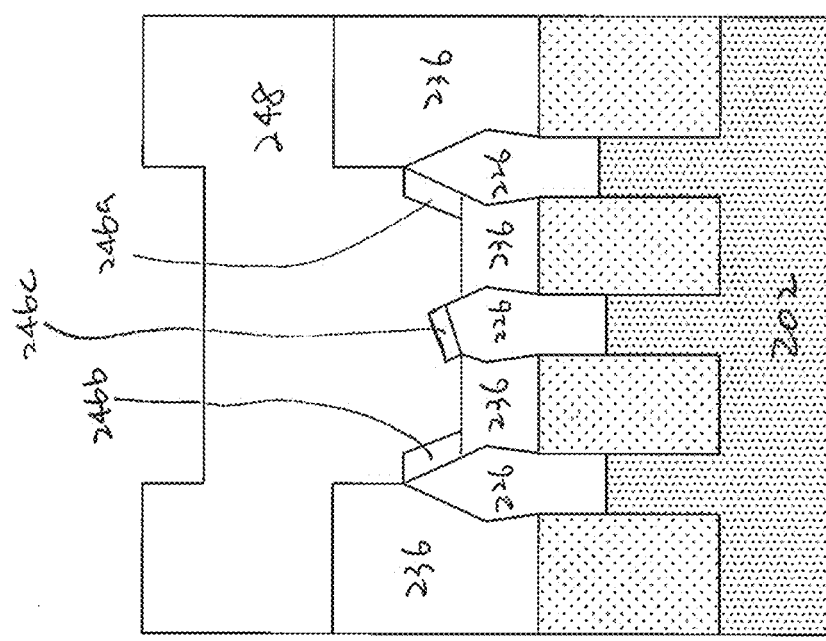

Referring to FIG. 14, following formation of the contact structure 230, the structure in FIG. 14 is produced by forming a second metal layer 248 filling in the opening 238 of the dielectric layer 236, thereby connecting the first germanide 246a, second germanide 246b, and third germanide 246c. In some embodiments, the second metal layer 248 comprises Al, Cu, W, Co, Ti, Ni, or Ta.

In some embodiments, the second metal layer 248 may be formed by CVD, PVD, plating, ALD, or other suitable technique. In some embodiment, the second metal layer 248 may comprise a laminate. The laminate may further comprise a barrier metal layer, a liner metal layer and/or a wetting metal layer. Further, the thickness of the second metal layer 248 will depend on the depth of the opening 238. The second metal layer 248 is thus deposited until the opening 238 is substantially filled or over-filled.

Then, another CMP is performed to planarize the second metal layer 248 after filling the opening 238 (shown in FIG. 15). Since the CMP removes a portion of the second metal layer 248 outside of the opening 238, the CMP process may stop when reaching the ILD layer 236, and thus providing a substantially planar surface.

After the steps shown in FIG. 1, as further illustrated with respect to the example depicted in FIGS. 2A-15, have been performed, subsequent processes, comprising interconnect processing, are performed to complete the semiconductor device 200 fabrication. It has been observed that the contact structure 230 comprising the germanide 246 with more volume may provide a low-resistance path for interconnection, thus upgrading the device performance.

In accordance with one embodiment, a contact structure for a semiconductor device comprises a substrate comprising a major surface; a fin structure extending upward from the substrate major surface, wherein the fin structure comprises a first fin, a second fin, and a third fin between the first fin and second fin; a first germanide over the first fin, wherein a first bottom surface of the first germanide has a first acute angle to the major surface; a second germanide over the second fin on a side of the third fin opposite to first germanide substantially mirror-symmetrical to each other; and a third germanide over the third fin, wherein a third bottom surface of the third germanide has a third acute angle to the major surface less than the first acute angle.

In accordance with another embodiment, a fin field effect transistor (FinFET) comprises a substrate comprising a major surface; a fin structure extending upward from the substrate major surface, wherein the fin structure comprises a first fin, a second fin, and a third fin between the first fin and second fin; a gate stack crossing over a channel portion of the fin structure; a shallow trench isolations (STI) region disposed on one side of the gate stack, wherein the STI region is within the substrate; and a contact structure distributed between the gate stack and the STI region, wherein the contact structure comprises a first germanide over the first fin, wherein a first bottom surface of the first germanide has a first acute angle to the major surface; a second germanide over the second fin on a side of the third fin opposite to first germanide substantially mirror-symmetrical to each other; and a third germanide over the third fin, wherein a third bottom surface of the third germanide has a third acute angle to the major surface less than the first acute angle.

In accordance with another embodiment, a method of fabricating a semiconductor device comprises providing a substrate; forming a fin structure extending upward from a major surface of the substrate, wherein the fin structure comprises a first fin, a second fin, and a third fin between the first fin and second fin; forming an inter-layer dielectric (ILD) layer over the fin structure; forming an opening in the ILD layer to expose a facet of the first fin, a facet of the second fin, and a planar surface of the third fin; forming a metal layer over the ILD layer and extending over the facet of the first fin, facet of the second fin, and planar surface of the third fin; and heating the substrate to form a germanide over the facet of the first fin, facet of the second fin, and planar surface of the third fin.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact structure for a semiconductor device comprising:
   a substrate comprising a major surface;
   a fin structure extending upward from the major surface, wherein the fin structure comprises a first fin, a second fin, and a third fin between the first fin and second fin;
   a first germanide over the first fin, wherein a first bottom surface of the first germanide has a first acute angle to the major surface;
   a second germanide over the second fin on a side of the third fin opposite to first germanide, wherein the first germanide and second germanide are substantially mirror-symmetrical to each other; and
   a third germanide over the third fin, wherein a third bottom surface of the third germanide has a second acute angle to the major surface less than the first acute angle.

2. The contact structure of claim 1, wherein a ratio of the second acute angle to the first acute angle is from about 0.05 to about 0.5.

3. The contact structure of claim 1, wherein the first fin comprises a first facet facing toward the third fin and a second facet facing away from the third fin, wherein the first germanide is on the first facet and not on the second facet.

4. The contact structure of claim 3, wherein the third fin comprises a substantially planar surface lower than a transition point of the first facet and second facet, wherein the third germanide is on the substantially planar surface.

5. The contact structure of claim 1, wherein a first area of the first germanide is greater than a third area of the third germanide.

6. The contact structure of claim 5, wherein a ratio of the third area to the first area is from about 0.3 to about 0.9.

7. The contact structure of claim 1, wherein the germanide comprises a material selected from the group consisting of NiGe, PtGe, TiGe2, CoGe2, PdGe, and combinations thereof.

8. The contact structure of claim 1 further comprising a metal layer connecting the first germanide, second germanide, and third germanide.

9. The contact structure of claim 8, wherein the metal layer comprises a material selected from the group consisting of Al, Cu, W, Co, Ti, Ni, Ta, and combinations thereof.

10. A fin field effect transistor (FinFET) comprising:
    a substrate comprising a major surface;
    a fin structure extending upward from the major surface, wherein the fin structure comprises a first fin, a second fin, and a third fin between the first fin and second fin;
    a gate stack crossing over a channel portion of the fin structure;
    a shallow trench isolations (STI) region disposed on one side of the gate stack; and
    a contact structure distributed between the gate stack and the STI region, wherein the contact structure comprises
       a first germanide over the first fin, wherein a first bottom surface of the first germanide has a first acute angle to the major surface;
       a second germanide over the second fin on a side of the third fin opposite to first germanide substantially minor-symmetrical to each other; and
       a third germanide over the third fin, wherein a third bottom surface of the third germanide has a second acute angle to the major surface less than the first acute angle.

11. The FinFET of claim 10, wherein a ratio of the second acute angle to the first acute angle is from about 0.05 to about 0.5.

12. The FinFET of claim 10, wherein the first fin comprises a first facet proximate the third fin and a second facet far distal the third fin, wherein the first germanide is only on the first facet.

13. The FinFET of claim 12, wherein the third fin comprises a substantially planar surface lower than a transition point of the first facet and second facet, wherein the third germanide is on the substantially planar surface.

14. The FinFET of claim 10, wherein a first area of the first germanide is greater than a third area of the third germanide.

15. The FinFET of claim 14, wherein a ratio of the third area to the first area is from about 0.3 to about 0.9.

16. The FinFET of claim 10, wherein the germanide comprises a material selected from the group consisting of NiGe, PtGe, TiGe2, CoGe2, PdGe, and combinations thereof.

17. The FinFET of claim 10 further comprising a metal layer connecting the first germanide, second germanide, and third germanide.

18. The FinFET of claim 17, wherein the metal layer comprises a material selected from the group consisting of Al, Cu, W, Co, Ti, Ni, Ta, and combinations thereof.

19. A method of fabricating a semiconductor device, comprising:

providing a substrate having a major surface;

forming a fin structure extending upward from the major surface of the substrate, wherein the fin structure comprises a first fin, a second fin, and a third fin between the first fin and second fin;

forming an inter-layer dielectric (ILD) layer over the fin structure;

forming an opening in the ILD layer to expose a facet of the first fin, a facet of the second fin, and a planar surface of the third fin;

forming a metal layer over the ILD layer and extending over the facet of the first fin, facet of the second fin, and planar surface of the third fin; and heating the substrate to form a germanide over the facet of the first fin wherein a first bottom surface of the first germanide has a first acute angle to the major surface, over the facet of the second fin, wherein the first germanide and second germanide are substantially mirror-symmetrical to each other, and over the planar surface of the third fin wherein a third bottom surface of the third germanide has a second acute angle to the major surface less than the first acute angle.

20. The method of claim 19, wherein the step of heating the substrate to form a germanide comprises:

heating the substrate at a temperature of about 200° C. to about 300° C.;

removing remaining metal layer; and heating the substrate at a temperature of about 300° C. to about 400° C.

* * * * *